United States Patent
McLeod et al.

[11] Patent Number: 6,156,154
[45] Date of Patent: Dec. 5, 2000

[54] APPARATUS FOR ETCHING DISCS AND PALLETS PRIOR TO SPUTTER DEPOSITION

[75] Inventors: Paul Stephen McLeod, Berkeley; John Bruno, Martinez, both of Calif.

[73] Assignee: Seagate Technology, Inc., Scotts Valley, Calif.

[21] Appl. No.: 09/338,078

[22] Filed: Jun. 23, 1999

Related U.S. Application Data

[60] Provisional application No. 60/090,428, Jun. 24, 1998.

[51] Int. Cl.⁷ .................................................... C23F 1/12
[52] U.S. Cl. .................................. 156/345; 118/723 MR; 118/723 MA
[58] Field of Search .......................... 156/345; 414/217; 128/200.14; 204/298.25; 451/5

[56] References Cited

U.S. PATENT DOCUMENTS

| | | | |
|---|---|---|---|
| 4,178,877 | 12/1979 | Kudo | 118/728 |
| 4,272,351 | 6/1981 | Kotani et al. | 204/202 |
| 4,292,153 | 9/1981 | Kudo et al. | 204/164 |
| 4,405,435 | 9/1983 | Tateishi et al. | 204/298.25 |
| 4,431,898 | 2/1984 | Reinberg et al. | 219/121.43 |
| 4,492,610 | 1/1985 | Okano et al. | |
| 4,552,639 | 11/1985 | Garrett | |
| 4,582,720 | 4/1986 | Yamazaki | 427/573 |
| 4,668,338 | 5/1987 | Maydan et al. | |
| 4,740,268 | 4/1988 | Bukhman | |
| 4,911,810 | 3/1990 | Lauro et al. | 204/192.12 |
| 5,032,205 | 7/1991 | Hershkowitz et al. | |
| 5,215,420 | 6/1993 | Hughes et al. | 414/217 |
| 5,425,611 | 6/1995 | Hughes et al. | 414/217 |
| 5,584,963 | 12/1996 | Takahashi et al. | 134/22.1 |
| 5,705,044 | 1/1998 | Washburn et al. | 204/298.25 |
| 5,956,581 | 9/1999 | Yamazaki et al. | 438/166 |

OTHER PUBLICATIONS

J. Storer et al "Transport of vacuum arc plasma through straight and curved magnetic ducts", J.App. Phys. 66,(11), pp. 5245–5250, Dec. 1989.

*Primary Examiner*—Gregory Mills
*Assistant Examiner*—Rudy Zervigon
*Attorney, Agent, or Firm*—Merchant & Gould P.C.

[57] ABSTRACT

Embodiments of the invention are directed to an etching apparatus for removing impurities from the surface of a substrate, such as a pallet and disc. Embodiments of the etching apparatus comprise a magnetic source, a cleaning chamber, a substrate transportation mechanism and a power source. The magnetic source is placed within the cleaning chamber, or vacuum chamber, which is configured to bombard the magnetic source with plasma. The substrate transportation mechanism resides within the cleaning chamber and is used to pull the pallet through the chamber between the spacing between the magnet towers. The power source, which is a DC source, is coupled to the pallet and produces an electric field which ionizes the plasma.

7 Claims, 3 Drawing Sheets

APPARATUS FOR ETCHING DISCS AND PALLETS PRIOR TO SPUTTER DEPOSITION

CROSS REFERENCE TO RELATED APPLICATIONS

The present application claims the benefits under 35 U.S.C. 119(e) of U.S. provisional application Ser. No. 60/090,428 filed on Jun. 24, 1998 now abandoned.

FIELD OF THE INVENTION

This invention is directed to an apparatus for removing previously deposited materials on discs and on the pallets used to transport the discs. More specifically, embodiments of the invention are directed to an apparatus that removes materials deposited on discs and the pallets by transporting the pallets containing the discs through an array of magnets in a vacuum, wherein the pallet is bombarded with ions.

BACKGROUND OF THE DISCLOSURE

During the manufacture of discs, multiple discs are placed on a platform, or pallet, for ease of transport and manufacture. As commonly known in the art, the storage of data on the discs requires that the discs include magnetic layers of material on the surface. Magnetic layers are deposited onto the disc through a process known as sputter deposition. During the sputter deposition, the discs are arranged on the pallet such that the surface which will receive the magnetic layers is facing upwards.

Prior to storing information or depositing magnetic layers on the discs, impurities which may have collected on the surface of the discs must be removed. In addition, any impurities contained on the pallets must also be removed. Typically, the pallets, which are used during multiple deposition, are covered with layers of material which were previously deposited on discs during prior depositions. If not removed, these previously deposited materials can outgas during subsequent heating and deposition, thereby degrading the performance of the magnetic layers.

In some current systems, to remove the impurities from the discs and the pallets, the pallets and the discs are placed in a low pressure vacuum chamber. Placing the pallet and discs in a low pressure vacuum chamber allows high vapor materials, such as water and alcohol, to be removed. However, although high vapor materials are removed, other materials, such as oil and grease are not removed by the low pressure vacuum chamber.

To remove impurities or materials that cannot be removed by the low pressure vacuum alone, some current systems utilize a process known as sputter deposition. Sputter deposition is a process by which high energy ions hit a substrate surface, such as the surface of a pallet, wherein the impact of the ions removes impurities on the surface of the substrate. In these systems, a negative RF bias is applied to the pallet with an RF power supply and the pallets and discs are bombarded with an ion flux, such as, for example, oxygen, argon or carbon dioxide. The ions chemically attack, or react, with the impurities and thereby remove the impurities. These systems, however, suffer in that the sputter deposition not only removes impurities, but can damage the surface of the substrate, such as the pallet or the disc. Further, the use of an RF power supply, which has a high noise factor, increases the danger to personnel and further increases potential electrical problems. A need in the industry exists to increase the rate of reduction, or cleaning rate, of the pallets and discs, while reducing the risks of electrocution of the users or other electrical problems of the apparatus.

SUMMARY OF THE DISCLOSURE

Embodiments of the invention are directed to an etching apparatus for removing impurities from the surface of a substrate, such as a pallet and disc. Embodiments of the etching apparatus comprise a magnetic source, a cleaning chamber, a substrate transportation mechanism and a power source.

The magnetic source is a pair of permanent magnet towers that are spaced a distance d apart from each other. In one embodiment, the magnetic source is a planar magnetic array. The magnetic source is placed within the cleaning chamber, or vacuum chamber, which is configured to bombard the magnetic source with plasma. The substrate transportation mechanism resides within the cleaning chamber and is used to pull the pallet through the chamber between the spacing between the magnet towers.

The power source, which is a DC source, is coupled to the pallet and produces an electric field. The plasma, which bombards the pallet is ionized as it passes through the electric field. The magnet field created by the magnetic source is accelerates the plasma particles and focuses the particles on a local portion of the pallet. The localized ions more effectively remove impurities and clean the pallet and disc surfaces.

BRIEF DESCRIPTION OF THE DRAWINGS

The detailed description of preferred embodiments of the invention will be made with reference to the accompanying drawings, wherein like numerals designate corresponding parts in the figures.

DETAILED DESCRIPTION OF THE EMBODIMENTS

Figure 1:
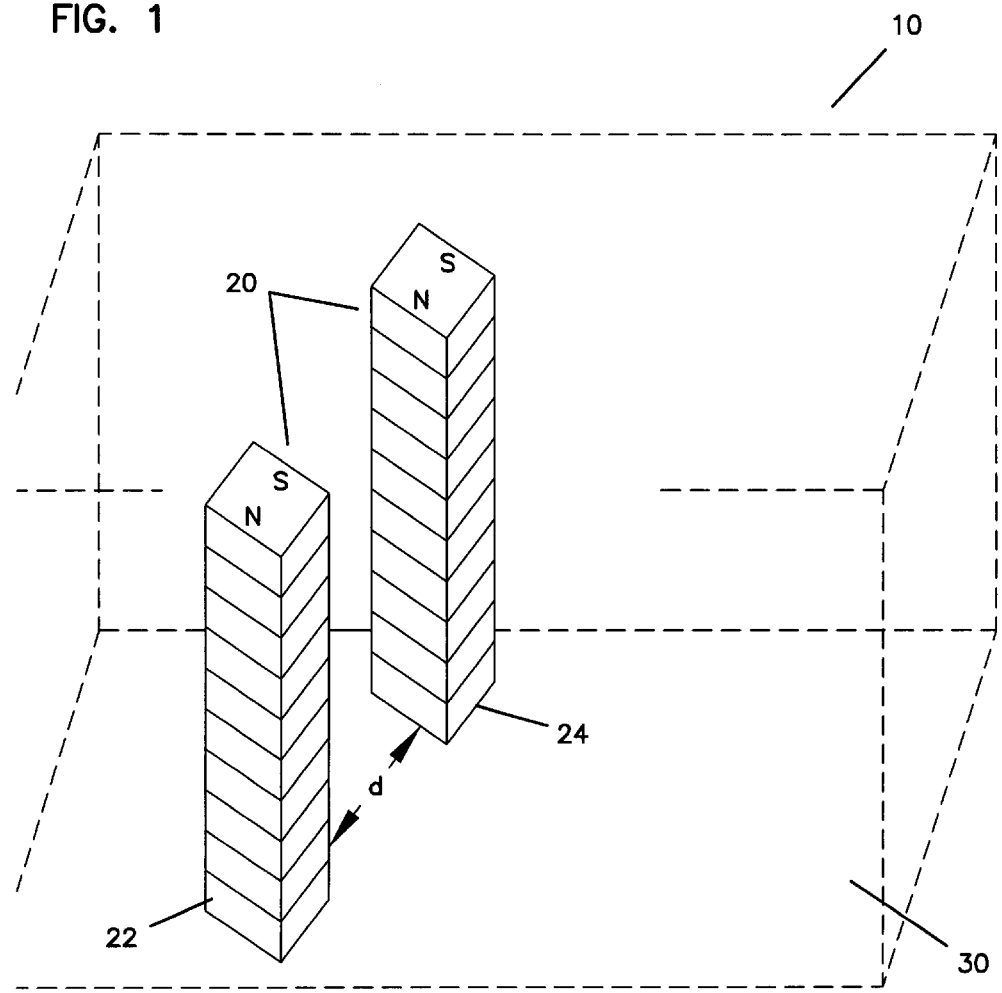
FIG. 1 depicts an embodiment of the etching apparatus including a parallel column of magnets for passing through the pallet.

Embodiments of the instant invention are directed to an etching apparatus 10 for removing impurities from the surface of a substrate. Embodiments of the etching apparatus 10 comprise a magnetic source 20, a cleaning chamber 30, a substrate transportation mechanism 40 and a power source 50.

The magnetic source 20 comprises a first array 22 and a second array 24 of fixed permanent magnets 26. With reference to FIG. 1, the arrays 22, 24 of magnets are aligned parallel a distance d apart from each other. In one embodiment, the distance d between the first array 22 and the second array 24 is 2.5 cm (1.0 inches).

Figure 2:
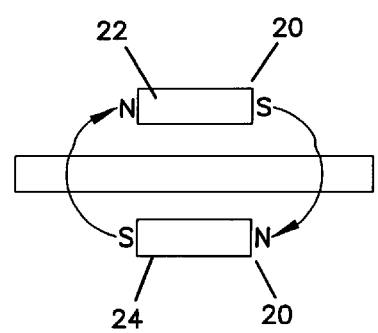
FIG. 2 depicts a top view of the embodiment in FIG. 1, wherein the magnetic field and an orientation of the magnets are shown.

The first array 22 and the second array 24 are positioned such that a magnetic field is created between the arrays 22, 24. For instance, and with reference to FIG. 2, the north pole of the first array 22 creates a magnetic field flux with the south pole of the second array 24. Similarly, the south pole of the first array 22 creates a magnetic field flux with the north pole of the second array 24. The height of the magnetic arrays 22, 24 is any height that will allow a magnetic field to pass through the object placed between, or passed through, the distance d between the arrays 22, 24.

The magnetic source 20 is placed within a cleaning chamber 30, wherein the cleaning chamber is a low pressure vacuum chamber. In one embodiment, the pressure in the chamber 30 is 1×10$^{-2}$ torr. The chamber 30 is box-like in shape, although any other shape which is suitable for storing the magnetic arrays 22, 24 is suitable. Further, the vacuum chamber 30 is designed to contain a plasma, such as, for example, oxygen, argon and carbon dioxide. The plasma which passes between the first array 22 and the second array 24 is concentrated by the magnetic field such that the ionization rate between the arrays 22, 24 is higher than the ionization rate in the remaining chamber 30. Thus, any objects passed between the arrays 22, 24 are bombarded with a higher ionization flux than in any other portion of the chamber 30.

The substrate transportation mechanism 40 allows the pallet 60 containing the discs 62 to be moved between the magnetic arrays 22, 24 through the plasma. The substrate transportation mechanism includes an overhead track and drive wheel assembly which is electrically isolated from the pallet, allowing the pallet to be driven through the vacuum chamber at an applied voltage. This is accomplished by contacting the pallet at the base by a suitable means such as brushes, sliding metal fingers or rollers.

A power supply 50 is coupled to the pallet 60 such that a negative bias is created in the pallet 60. In one embodiment, the power supply 50 is a direct current ("DC") power supply. The power supply 50 places an electric charge on the discs 62 and the pallet 60, thereby increasing the negatively charged area. The ions are attracted to the pallet with a higher energy, which increases, or accelerates, the etch rate. As the power supply 50 is a DC power supply, the cost for operating the system is less than the operation costs of the power for systems utilizing an RF power supply. Further, the DC power supply 50 decreases risks with respect to electrocution of the users and electronic problems of the apparatus.

Figure 3:
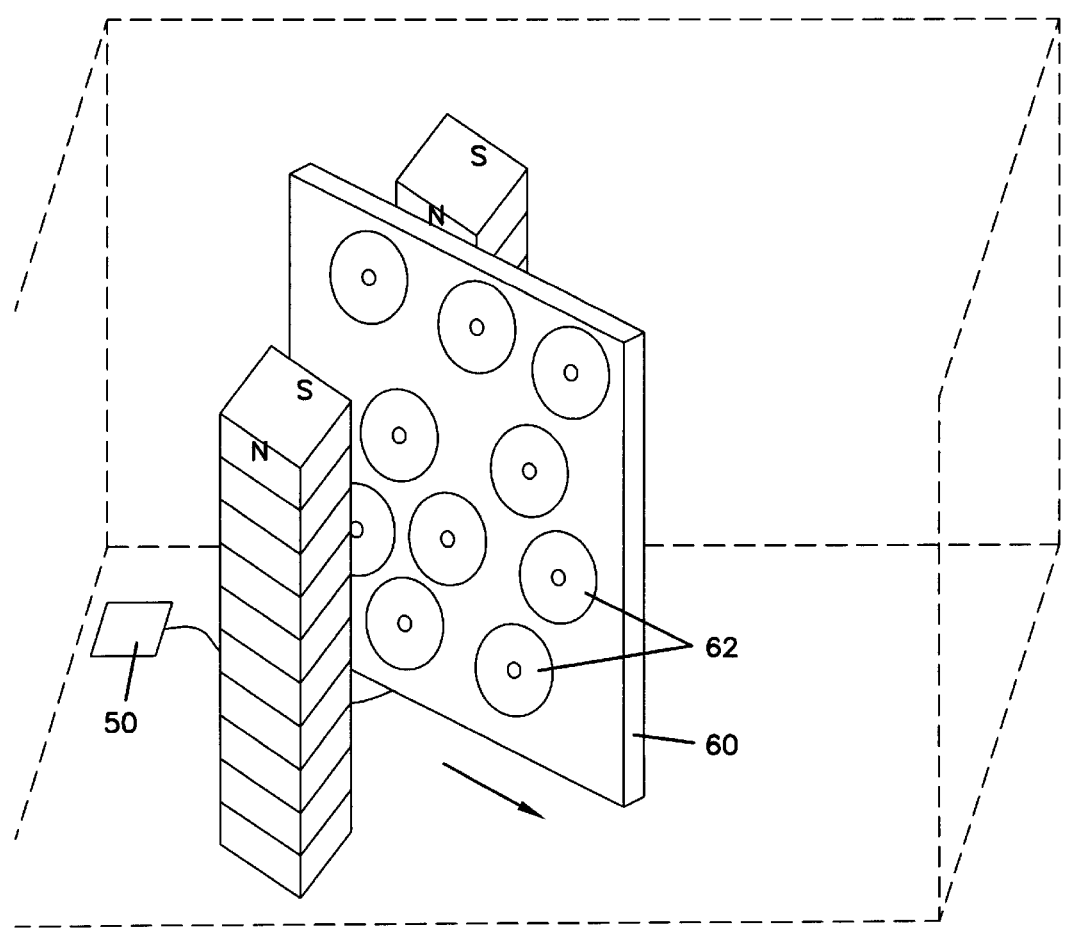
FIG. 3 depicts embodiment of FIG. 1, wherein a pallet containing discs are being passed through the magnetic arrays.

With respect to FIG. 3, in operation, a rectangular pallet 60 containing multiple discs 62 coupled to its surface is pulled through the magnetic arrays in the vacuum chamber. Although the pallets 60 are rectangular in shape, any shape capable of supporting multiple discs 62 and passing between the magnetic arrays 22,24 is suitable. The pallets 60 are made from aluminum, although any material which has a thermal expansion coefficient similar to the disc and has been designed to be dimensionally stable during heating is sufficient. As the pallet 60 is transported through the vacuum chamber, an electric current is placed across the pallet such that an electric charge is placed on the pallet 60 and discs 62.

In addition to the electric current, the magnets produce a magnetic field. The magnetic field concentrates the plasma, that is, the ions, in a localized portion 64 of the pallet. In one embodiment, a half inch wide line is formed parallel to the vertical axis of the arrays such that a concentrated vertical line of ions are focused on the pallet as it passes through the arrays. The magnetic field in conjunction with the electric current increases the ionization rate, or cleaning rate, of the pallet 60 and discs 62. The movement of the pallet 60 in conjunction with the focusing of the ions by the magnets 26 improves the uniformity of the etching of both the pallet 60 and the discs 62.

Figure 4:
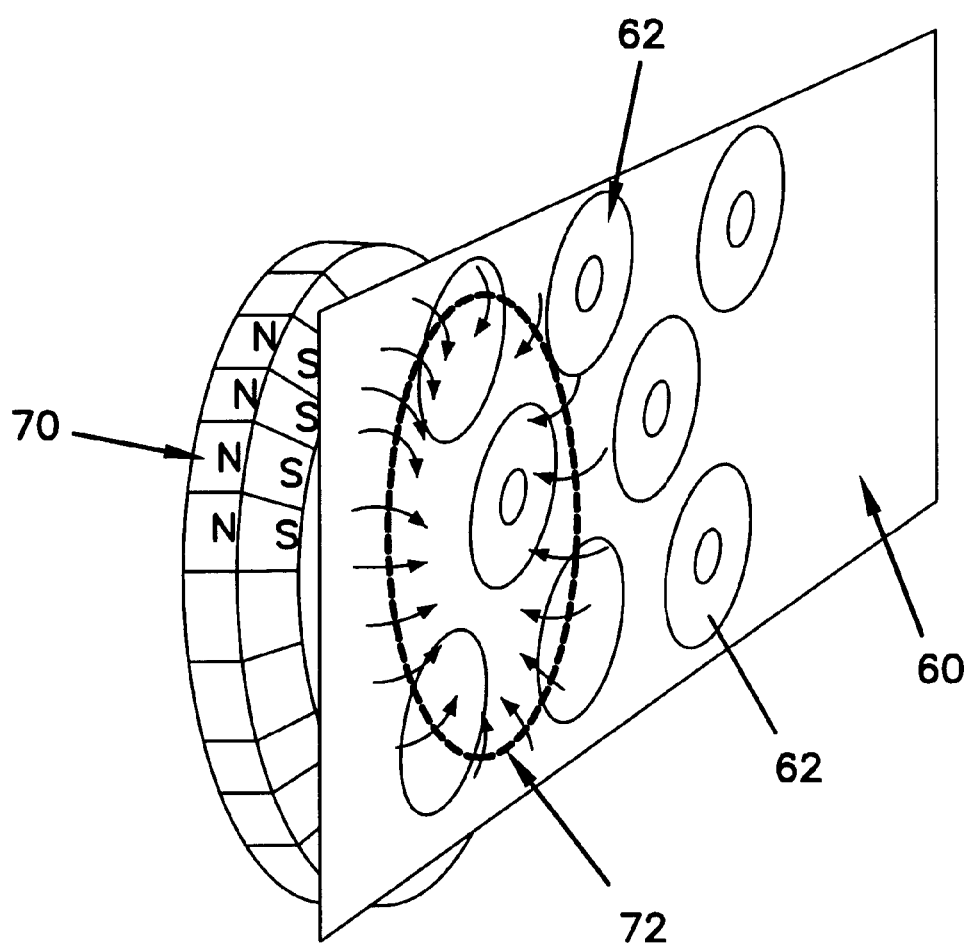
FIG. 4 depicts another embodiment of an etching apparatus, including a planar magnetic array.

With reference to FIG. 4, another embodiment utilizes a planar magnetic array 70. In this embodiment, the magnet dipoles are arranged in a racetrack oval, wherein the north pole is placed along the perimeter of the oval. As such, the magnetic field lines pass through the pallet 60, into the discs 62 and back into the south pole. Similar to the linear array, the magnetic field concentrates the plasma. However, due to the shape of the oval array, the plasma is concentrated in a ring 72.

Although FIG. 4 only depicts one oval array 70, a second oval array (not shown) is positioned across and offset from the depicted oval array 70 such that the pallet 60 passes between the two oval arrays during operation. Similar to the linear array arrangement, the lines of etch rate or the ionization rate of the pallet 60 is enhanced as the pallet 60 passes between the oval arrays.

It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the etching apparatus while maintaining substantially the same functionality without department from the scope and spirit of the present invention, such as, for example, the shape of the magnetic array. In addition, although the preferred embodiment described herein is directed to an etching apparatus for cleaning pallets and discs prior to disc manufacture, it will be appreciated by those skilled in the art that the teachings of the present invention can be applied to other systems without departing from the scope and spirit of the present invention.

What is claimed is:

1. An apparatus for etching discs and substrates prior to sputter deposition of said discs and substrates for depositing magnetic material onto said discs and substrates comprising:
   pallets supporting said discs and substrates;
   a magnetic source;
   a hollow chamber for etching said discs and substrates and said pallets, wherein
      said magnetic source is disposed within said chamber;
      a power source for applying an electric charge to said discs and substrates; and
      a substrate transportation mechanism, disposed within said chamber for transporting
      said charged discs and substrates along said magnetic source.

2. An apparatus as claimed in claim 1, wherein said magnetic source comprises a first array of magnets and a second array of magnets.

3. An apparatus as claimed in claim 2, wherein said first array is spaced apart from said second array such that said pallet can be transported therebetween.

4. An apparatus as claimed in claim 1, wherein said hollow chamber is a vacuum chamber that is configured to ionize a plasma.

5. An apparatus as claimed in claim 1, wherein said power source is a direct current power source.

6. An apparatus as claimed in claim 1, wherein said magnetic source is a planar magnetic array.

7. A method for removing impurities from discs and pallets transporting said discs prior to sputter deposition of said discs for depositing magnetic material onto said discs, comprising:
   ionizing a plasma in a hollow chamber, wherein said hollow chamber includes a magnetic source;
   placing a pallet containing discs into said hollow chamber;
   applying an electric charge onto said pallet such that an electric field is created;
   transporting said pallet and discs along said magnetic source such that the magnetic field concentrates plasma in a localized portion of said pallet, thereby removing impurities.

* * * * *